United States Patent
Tsukamoto

(10) Patent No.: US 8,252,365 B2
(45) Date of Patent: Aug. 28, 2012

(54) METHOD OF MANUFACTURING PIEZOELECTRIC ELEMENT AND METHOD OF MANUFACTURING LIQUID EJECTION HEAD

(75) Inventor: Ryuji Tsukamoto, Kanagawa-ken (JP)

(73) Assignee: Fujifilm Corporation, Tokyo (JP)

(*) Notice: Subject to any disclaimer, the term of this patent is extended or adjusted under 35 U.S.C. 154(b) by 916 days.

(21) Appl. No.: 12/057,151

(22) Filed: Mar. 27, 2008

(65) Prior Publication Data

US 2008/0241363 A1     Oct. 2, 2008

(30) Foreign Application Priority Data

Mar. 30, 2007 (JP) ................. 2007-095521

(51) Int. Cl.
    *B41J 2/16*     (2006.01)
    *B41J 2/04*     (2006.01)
(52) U.S. Cl. .......... 427/100; 427/58; 427/457; 427/466; 347/54; 347/68; 347/70; 347/71; 347/72; 174/68.1; 174/259
(58) Field of Classification Search .................. 427/100; 347/70, 71
    See application file for complete search history.

(56) References Cited

U.S. PATENT DOCUMENTS

| | | | | |
|---|---|---|---|---|
| 5,137,045 | A * | 8/1992 | Gerber et al. .................. | 137/13 |
| 6,347,862 | B1 | 2/2002 | Kanno et al. | |
| 2001/0005213 | A1 * | 6/2001 | Ikeda et al. ....................... | 347/70 |
| 2006/0092239 | A1 * | 5/2006 | Sung et al. ....................... | 347/71 |
| 2006/0214976 | A1 * | 9/2006 | Iwao et al. ....................... | 347/19 |
| 2007/0069263 | A1 * | 3/2007 | Mizuuchi et al. ............. | 257/295 |
| 2007/0144000 | A1 * | 6/2007 | Hirota et al. .................. | 29/890.1 |
| 2007/0278906 | A1 * | 12/2007 | Florian et al. .................. | 310/359 |
| 2008/0218559 | A1 * | 9/2008 | Fujii et al. ....................... | 347/68 |

FOREIGN PATENT DOCUMENTS

| | | | |
|---|---|---|---|
| JP | 71004710 | * | 9/1967 |
| JP | 10-286953 A | | 10/1998 |
| WO | WO 2004107466 | * | 12/2004 |

OTHER PUBLICATIONS

Moseley et al., Sensor Materials, CRC Press, (1996), pp. 119.*
Rosato et al., Plastics Engineering, Springer, (2001), pp. 130.*
Law et al., "A Model for Structural Hysteresis in Poling and Thermal Depoling of PZT Ceramics", Journal of Material Science, vol. 30, 1995, pp. 4901-4905.*

* cited by examiner

Primary Examiner — Nathan Empie
Assistant Examiner — Lisha Jiang
(74) Attorney, Agent, or Firm — Birch, Stewart, Kolasch & Birch, LLP

(57) ABSTRACT

The method of manufacturing a piezoelectric element includes the steps of: a lower electrode forming step of forming a lower electrode on a surface of a substrate; a piezoelectric film deposition step of depositing a piezoelectric film made of a piezoelectric material by one of epitaxial growth and oriented growth onto a surface of the lower electrode reverse to a surface adjacent to the substrate; an upper electrode forming step of forming an upper electrode onto a surface of the piezoelectric film reverse to a surface adjacent to the lower electrode; and a polarization direction reversal step of reversing a polarization direction of the piezoelectric film by applying an alternating electric field of an intensity not lower than a coercive electric field of the piezoelectric material, between the upper electrode and the lower electrode, and then applying a direct electric field of an intensity not lower than the coercive electric field in a direction from the upper electrode toward the lower electrode.

2 Claims, 10 Drawing Sheets

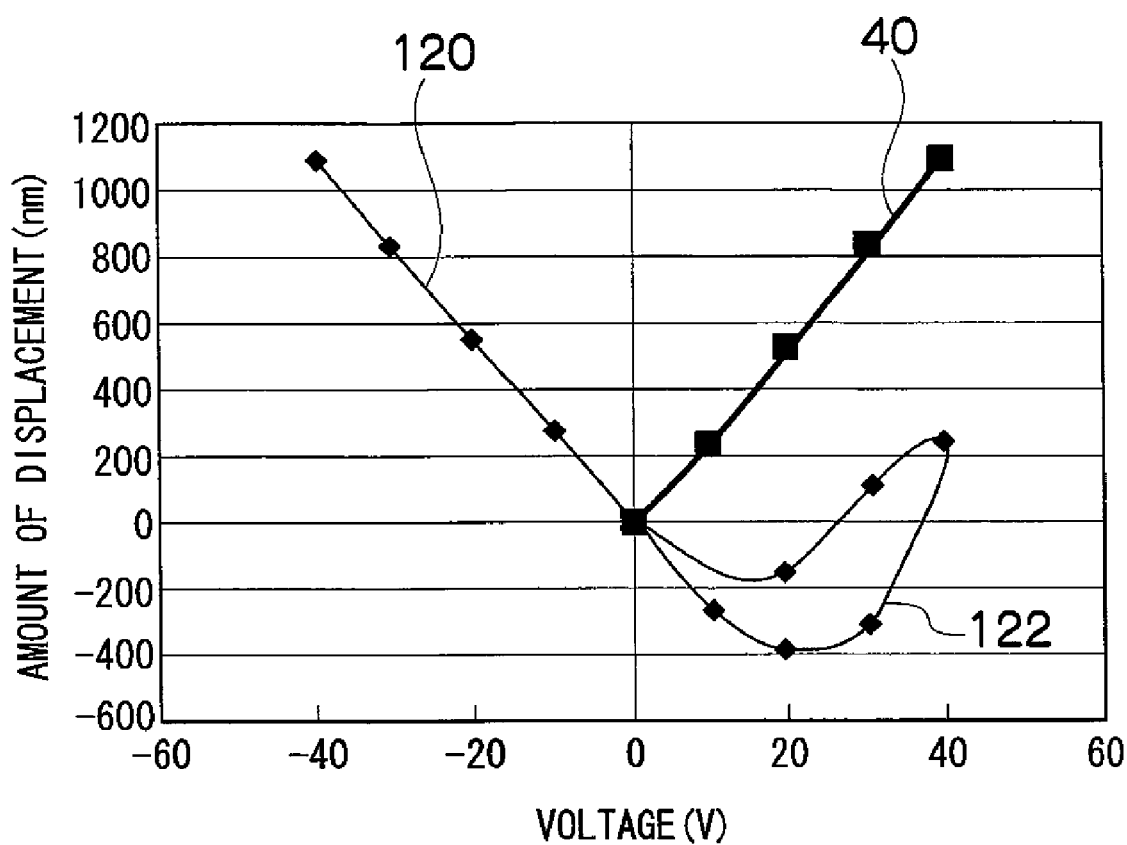

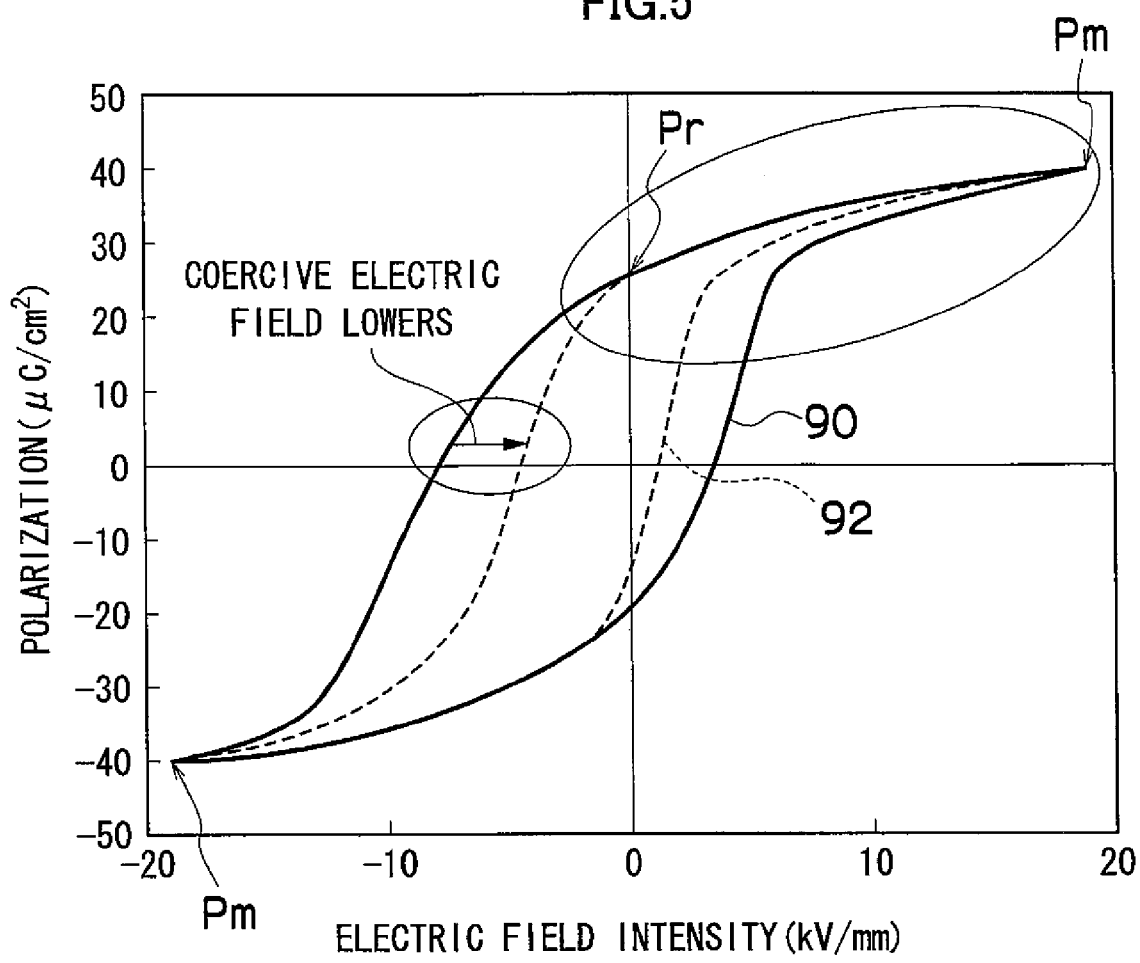

FIG.10
RELATED ART

| ISSUE | SOLUTION | PROBLEM |
|---|---|---|
| DIRECTION OF ORIENTATION IS OPPOSITE | TRANSFER PREVIOUSLY MANUFACTURED PIEZOELECTRIC ELEMENT TO PRESSURE CHAMBER | POSITIONING DIFFICULTIES |
| | USE LOWER ELECTRODE AS ADDRESS ELECTRODE | LEAKAGE CURRENT |
| | DRIVE WITH NEGATIVE VOLTAGE | HIGH COSTS |

METHOD OF MANUFACTURING PIEZOELECTRIC ELEMENT AND METHOD OF MANUFACTURING LIQUID EJECTION HEAD

BACKGROUND OF THE INVENTION

1. Field of the Invention

The present invention relates to a method of manufacturing a piezoelectric element and a method of manufacturing a liquid ejection head, and more particularly, to technology for manufacturing an oriented piezoelectric element deposited by means of a sputtering method, or the like.

2. Description of the Related Art

In general, an inkjet recording apparatus, which forms a desired image by ejecting ink droplets onto a recording medium from an inkjet head, is used widely as a generic image forming apparatus. In the inkjet recording apparatus, piezoelectric elements (piezoelectric actuators) are suitable for use as pressure application devices for causing ink droplets to be ejected from the inkjet head.

Improvements in the printing characteristics, and in particular, the increase in the resolution and the increase in the printing speed are demanded in inkjet heads. For this purpose, it has been sought to increase the resolution and raise the printing speed by using a multiple-nozzle head structure in which nozzles are formed very finely and are also arranged at high density. In order to achieve a high-density arrangement of nozzles, compactification of the piezoelectric elements is highly necessary.

In order to make the piezoelectric elements more compact in size, it is valuable to reduce the thickness of the piezoelectric elements. For example, Japanese Patent Application Publication No. 10-286953 discloses technology in which, a lead dielectric layer (piezoelectric film) having a thickness of 3 μm is formed in order to achieve thin film thickness in the piezoelectric elements.

In the piezoelectric elements used in an inkjet head, if upper electrodes are used as address electrodes (individual electrodes), lower electrodes are used as ground electrodes (a common electrode), and the lower electrodes are grounded while the upper electrodes are applied with a positive voltage to drive the piezoelectric elements, then it is beneficial in terms of the cost of the devices, such as the ease of wiring, switching ICs (integrated circuits), and the like, and hence this wiring structure is appropriate. Hence, in general, the piezoelectric elements are subjected to polarization processing in such a manner that the piezoelectric elements deform in a direction that causes the liquid to be ejected when the lower electrodes are grounded while the upper electrodes are applied with a positive voltage.

Nevertheless, in Japanese Patent Application Publication No. 10-286953, a piezoelectric film is deposited on the lower electrode by sputtering, and therefore the polarization direction of the piezoelectric film is the direction from the lower electrode toward the upper electrode. More specifically, if a piezoelectric element 102 shown in FIG. 7 is produced by sputtering to deposit a piezoelectric film 112 on a lower electrode 110, then the polarization direction upon the deposition of the piezoelectric film 112 is the direction from the lower electrode 110 toward an upper electrode 114 (the upward direction indicated with an arrow A in FIG. 7). Then, in order to drive the piezoelectric element 102 having this composition to deform in the direction to apply pressure through a diaphragm 104 to liquid in a pressure chamber 106 to eject the liquid from a nozzle 108 (to deform in the direction indicated with an arrow B in FIG. 7), it is necessary to apply an electric field to the piezoelectric film 112 in the same direction as the polarization direction of the piezoelectric film 112. It is possible to adopt a method for this electric field application in which the upper electrode 114 is set to ground while a positive voltage is applied to the lower electrode 110 from a drive source 115. However if the upper electrode 114 is used as the ground electrode and the lower electrode 110 is used as the address electrode, then the wiring structure becomes complicated, and hence this method is not desirable from a structural and a manufacturing point of view.

In a general piezoelectric element, whether an electric field (voltage) is applied from the upper electrode toward the lower electrode, or whether an electric field is applied from the lower electrode toward the upper electrode, regardless of the direction of the applied electric field, it is possible to obtain the same amount of displacement provided that the electric field of the same intensity (voltage) is applied. On the other hand, in a piezoelectric element composed of a piezoelectric film formed by sputtering, the piezoelectric film innately exhibits an orientation (i.e., polarization direction) that is set when the piezoelectric film is deposited, and there is a phenomenon of variation in the amount of displacement of the piezoelectric element depending on the direction of the electric field applied to the piezoelectric film.

As shown in FIG. 8, when the electric field of intensity in the range of 0 kV/mm to −6.0 kV/mm is applied to the piezoelectric film in the piezoelectric element 102, then there is a direct proportional relationship between the applied electric field intensity and the amount of displacement (nanometers) of the piezoelectric element 102 (the characteristics represented with a line 120); however, when the applied electric field intensity is in the range of 0 kV/mm to 6.0 kV/=m, then not only is this direct proportional relationship lost, but also a phenomenon of reversal of the direction of displacement appears (the characteristics represented with a line 122).

As a method for avoiding these problems, there is a method of manufacturing an inkjet head by fabricating a piezoelectric element structure by sequentially depositing an upper electrode (114 in FIG. 7), a piezoelectric film (112 in FIG. 7) and a lower electrode (110 in FIG. 7) by sputtering onto a monocrystalline substrate of silicon (Si), magnesium oxide (MgO), or the like, (a so-called "dummy substrate"), and further forming a thin film serving as a diaphragm (104 in FIG. 7) onto the lower electrode, whereupon the thus fabricated piezoelectric element structure is mechanically inverted and transferred (bonded) to a pressure chamber structure formed in a silicon substrate or a glass substrate (corresponding to the base plate having the pressure chamber 106 formed therein in FIG. 7).

Further alternative methods of avoiding the aforementioned problems include a method where the upper electrode is used as the ground electrode and the lower electrode is used as the address electrode to be applied with a positive voltage, and a method where the lower electrode is used as the ground electrode and the upper electrode is used as the address electrode to be applied with a negative voltage to apply an electric field to the piezoelectric film in the negative direction (an electric field in the direction indicated with an arrow C in FIG. 7).

However, in the method where the previously fabricated piezoelectric element structure is mechanically inverted and transferred to the pressure chamber structure, costs are high since the monocrystalline substrate is thrown away after use. Furthermore, since the transfer bonding method is used, it is necessary to register the piezoelectric element structure and the pressure chamber structure accurately in position, but it is in fact extremely difficult to achieve accurate positioning between the piezoelectric element structure and the pressure chamber structure. The positioning accuracy of the piezoelectric element structure and the pressure chamber structure affects the ejection characteristics, and in an inkjet head having a plurality of nozzles, it is extremely difficult to fabricate the head having uniform ejection characteristics in the plurality of nozzles.

In the method of using the lower electrode 110 as the address electrode, then as shown in FIG. 9, if the diaphragm is made of silicon, a leakage current 130 arises and electrical cross-talk occurs whereby displacement is produced even in the piezoelectric elements that are not intended to be applied with the drive signal, and consequently there is a problem in that ink droplets are ejected from the nozzles that are not intended to be driven.

In the method of using the upper electrode 114 as the address electrode and applying the negative voltage to the upper electrode 114 to apply the electric field in the negative direction, the costs relating to the drive IC and the power source device required to apply the negative voltage are higher (several times to several tens of times higher) than those required for the positive voltage.

To summarize the above-described problems relating to the oriented piezoelectric film (namely, the piezoelectric film deposited by sputtering), the method that mechanically inverts the piezoelectric element structure and bonds same to the pressure chamber structure involves the problem of positioning accuracy during bonding, and the method that uses the lower electrode 110 as the address electrode involves the problem of electrical cross-talk occurring as a result of leakage current. Furthermore, the method that uses the electric field in the negative direction as the applied electric field involves the problem of increased costs in relation to the IC, and so on (see FIG. 10).

SUMMARY OF THE INVENTION

The present invention has been contrived in view of these circumstances, an object thereof being to provide a method of manufacturing a piezoelectric element and a method of manufacturing a liquid ejection head, whereby desirable piezoelectric elements are manufactured by an epitaxial growth method or an oriented growth method, such as sputtering.

In order to attain the aforementioned object, the present invention is directed to a method of manufacturing a piezoelectric element, comprising the steps of: a lower electrode forming step of forming a lower electrode on a surface of a substrate; a piezoelectric film deposition step of depositing a piezoelectric film made of a piezoelectric material by one of epitaxial growth and oriented growth onto a surface of the lower electrode reverse to a surface adjacent to the substrate; an upper electrode forming step of forming an upper electrode onto a surface of the piezoelectric film reverse to a surface adjacent to the lower electrode; and a polarization direction reversal step of reversing a polarization direction of the piezoelectric film by applying an alternating electric field of an intensity not lower than a coercive electric field of the piezoelectric material, between the upper electrode and the lower electrode, and then applying a direct electric field of an intensity not lower than the coercive electric field in a direction from the upper electrode toward the lower electrode.

In the piezoelectric film that is deposited by epitaxial growth or oriented growth, the polarization direction of the piezoelectric film upon the deposition is the direction of growth (direction of orientation), and when the piezoelectric film is grown from the lower electrode, then the polarization direction is the direction from the lower electrode toward the upper electrode. According to this aspect of the present invention, this polarization direction is reversed to the direction from the upper electrode toward the lower electrode, and the piezoelectric body is enabled to be operated by applying an electric field in the direction from the upper electrode toward the lower electrode. Thus, it is possible to control the amount of displacement and the direction of displacement of the piezoelectric body by using the lower electrode as a ground electrode and taking the upper electrode as an address electrode and applying a positive voltage to the upper electrode.

Moreover, since the polarization reversal processing can be carried out without applying high temperature or high voltage, then it is possible to carry out the polarization reversal processing of the piezoelectric element in a state where elements that are sensitive to high temperature and high voltage, such as an FPC or IC, have already been installed (for example, in a completed head).

It is preferable that the method includes a patterning step of patterning the upper electrode, the piezoelectric film and the lower electrode to prescribed shapes, and it is more preferable that the upper electrode and the piezoelectric film are patterned together in a common patterning step.

If a plurality of piezoelectric films (piezoelectric elements) are formed on the same substrate, then it is preferable that the lower electrodes formed on the substrate are used as the ground electrodes (i.e., a common electrode), the upper electrodes are taken as address electrodes (individual electrodes), and a positive voltage is applied to the upper electrodes.

It is possible to call the composition including the upper electrode, the piezoelectric film and the lower electrode as a piezoelectric element. Moreover, a structure which deforms another member bonded to the piezoelectric element by operating the piezoelectric element can be called a piezoelectric actuator. One example of the member included in the piezoelectric actuator is the substrate (diaphragm).

Preferably, the method further comprises a wiring member bonding step of bonding, to the piezoelectric element, a wiring member through which a drive voltage is applied between the upper electrode and the lower electrode from an external source.

For the wiring member, it is suitable to use a flexible cable (flexible printed circuit) in which a thin metal film wiring pattern is formed on an insulating material. A mode is also possible in which all or a portion of a driving circuit of the piezoelectric element is included in the wiring member.

Moreover, a conductive adhesive is suitable for use as the bonding material that bonds the wiring material and the wiring layer.

Preferably, the piezoelectric film deposition step is performed with at least one of sputtering, chemical vapor deposition, and sol gelation.

According to this aspect of the present invention, by using sputtering, CVD or sol gelation, it is possible to deposit a desirable piezoelectric film that is formed to a very small thickness.

In order to attain the aforementioned object, the present invention is also directed to a method of manufacturing a liquid ejection head including an ejection port from which liquid is ejected, an ejection side flow channel which is connected to the ejection port, a pressure chamber which is connected to the ejection side flow channel and accommodates the liquid to be ejected from the ejection port, and a piezoelectric element which pressurizes the liquid accommodated in the pressure chamber, the method comprising; a lower electrode forming step of forming a lower electrode on a surface of a substrate; a piezoelectric film deposition step of depositing a piezoelectric film made of a piezoelectric material by one of epitaxial growth and oriented growth onto a surface of the lower electrode reverse to a surface adjacent to the substrate; an upper electrode forming step of forming an upper electrode onto a surface of the piezoelectric film reverse to a surface adjacent to the lower electrode; a pressure chamber forming step of forming the pressure chamber on a surface of the substrate reverse to the surface on which the lower electrode is formed; a flow channel plate bonding step of bonding a flow channel plate formed with the ejection side flow channel to the substrate in which the pressure chamber is formed, after registering the ejection side flow channel and the pressure chamber mutually in position; an ejection port plate bonding step of bonding an ejection port plate formed with the ejection port to the flow channel plate, after registering the ejection port and the ejection side flow channel mutually in position; and a polarization direction reversal step of reversing a polarization direction of the piezoelectric film by applying an alternating electric field of an intensity not lower than a coercive electric field of the piezoelectric material, between the upper electrode and the lower electrode, and then applying a direct electric field of an intensity not lower than the coercive electric field in a direction from the upper electrode toward the lower electrode.

According to this aspect of the present invention, a desirable liquid ejection head is manufactured, which can eject liquid from the ejection port by using the upper electrode as an address electrode, taking the lower electrode as a ground electrode, and applying a positive voltage to the upper electrode (namely, applying an electric field to the piezoelectric element in the same direction as the polarization direction of the piezoelectric element).

In a piezoelectric film that is deposited by epitaxial growth or oriented growth, the polarization direction of the film upon the deposition is the direction of growth (direction of orientation), and when the piezoelectric film is grown from the lower electrode, then the polarization direction is the direction from the lower electrode toward the upper electrode; therefore, according to the present invention, this polarization direction is reversed to the direction from the upper electrode toward the lower electrode, and the piezoelectric body is operated by applying an electric field in the direction from the upper electrode toward the lower electrode, then it is possible to control the amount of displacement and the direction of displacement of the piezoelectric body.

Furthermore, a desirable liquid ejection head is manufactured, which is capable of ejecting liquid from the ejection port, by operating the piezoelectric element by using the upper electrode as an address electrode, taking the lower electrode as a ground electrode and applying a positive voltage to the upper electrode.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 3 is a diagram showing a comparison of the characteristics of a piezoelectric element manufactured by the manufacturing process shown in FIGS. 1A to 1H and a piezoelectric element manufactured by a piezoelectric element manufacturing method in the related art;

FIG. 5 is a diagram showing the characteristics of the piezoelectric element manufactured by the process shown in FIGS. 1A to 1H;

FIG. 10 is a diagram for describing problems associated with the related art.

DETAILED DESCRIPTION OF THE PREFERRED EMBODIMENTS

Description of Method of Manufacturing Liquid Ejection Head

A method of manufacturing a piezoelectric element and a method of manufacturing a liquid ejection head according to an embodiment of the present invention are described with reference to FIGS. 1A to 1H.

(1) Lower Electrode Forming Step

Figure 1A:
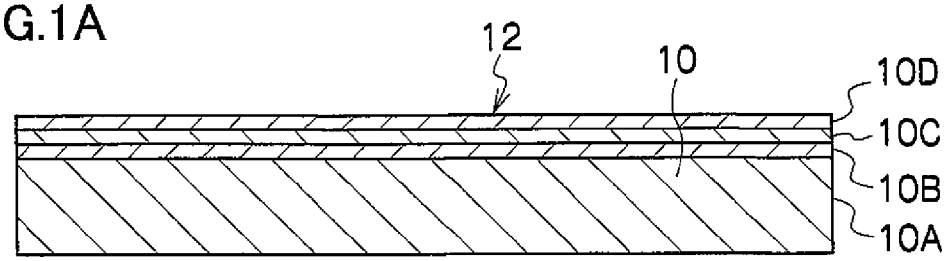
FIGS. 1A to 1H are diagrams showing steps of a method of manufacturing a liquid ejection head (method of manufacturing a piezoelectric element) according to an embodiment of the present invention.

As shown in FIG. 1A, a surface-insulated SOI (silicon on insulator) substrate (hereinafter referred to as the "substrate") 10, which is a silicon substrate provided with $SiO_2$ insulating films, is prepared. The substrate 10 shown in FIG. 1A has a structure in which a silicon base 10A, an insulating layer 101B of a silicon oxide film, a silicon base 10C, and an insulating layer 10D of a silicon oxide film, are layered together in sequence.

Figure 1B:
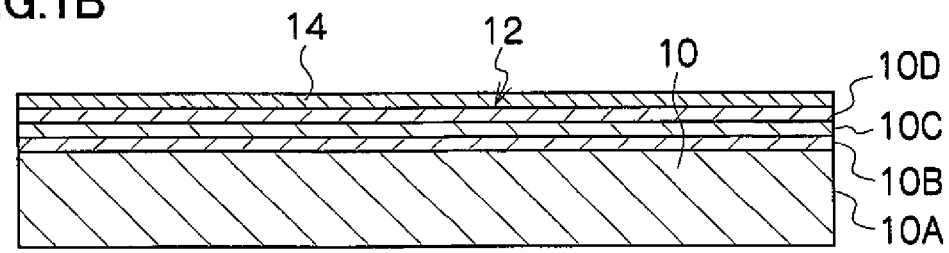

Then, a lower electrode 14 is deposited on the upper surface 12 of the substrate 10 (the surface where the insulating layer 10D is formed), by sputtering, vapor deposition, or the like, as shown in FIG. 1B. For the lower electrode 14, it is desirable to use iridium (Ir), platinum (Pt), titanium (Ti), or the like.

(2) Piezoelectric Film Depositing Step

Figure 1C:
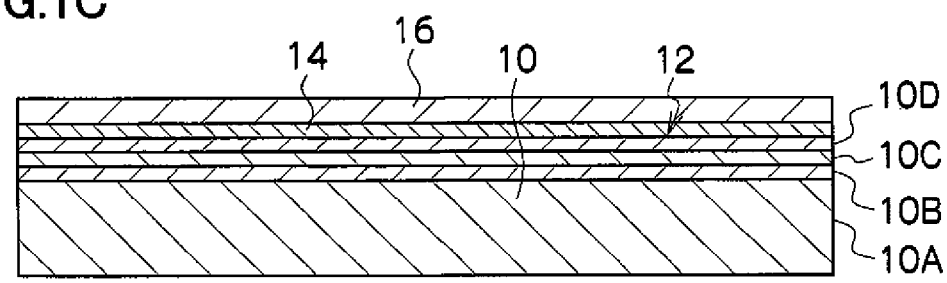

When the lower electrode 14 has been deposited, a piezoelectric film 16 having a prescribed orientation is deposited on the upper surface of the lower electrode 14 (the surface of the lower electrode 14 on the side reverse to the side adjacent to the insulating layer 10D), by means of an epitaxial growth method, such as sputtering, CVD (chemical vapor deposition), sol gelation, or the like, as shown in FIG. 1C. It is desirable to use PZT (lead zirconate titanate, $Pb(Zr, Ti)O_3$) for the piezoelectric film 16.

(3) Upper Electrode Depositing Step

Figure 1D:
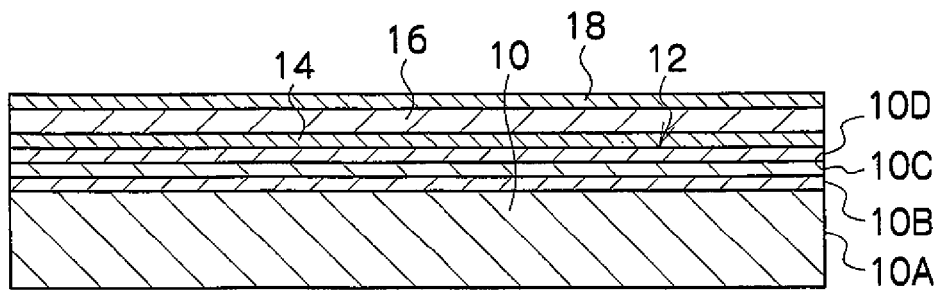
Figure 1E:
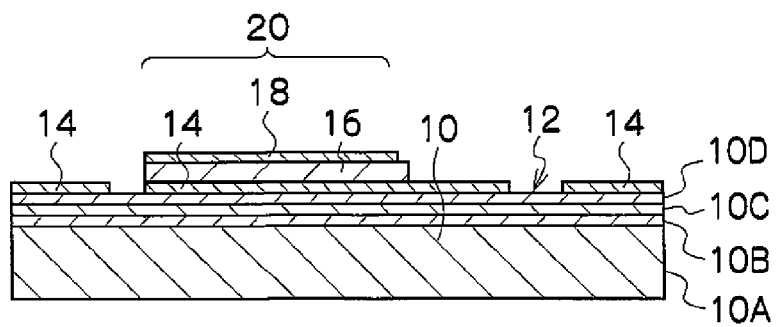

When the piezoelectric film 16 has been deposited, an upper electrode 18 is deposited by sputtering, or the like, on the upper surface of the piezoelectric film 16 (the surface of the piezoelectric film 16 on the side reverse to the side adjacent to the lower electrode 14) as shown in FIG. 1D. For the upper electrode 18, it is desirable to use iridium (Ir), platinum (Pt), titanium (Ti), gold (Au), tungsten (W), or the like.

In the present specification, the structure in which the piezoelectric film 16 is arranged between the lower electrode 14 and the upper electrode 18 is called a piezoelectric element 20, and a composition that causes another member to deform (vibrate) by driving the piezoelectric element 20 is called a piezoelectric actuator. One example of the piezoelectric actuator is a structure that causes the piezoelectric element 20 and a diaphragm (described in detail below).

(4) Piezoelectric Element Patterning Step

After carrying out the upper electrode depositing step, a step is carried out for processing the lower electrode 14, the upper electrode 18 and the piezoelectric film 16 into prescribed shapes, and the piezoelectric element 20, which has the upper electrode 18 on the upper surface of the piezoelectric film 16 and the lower electrode 14 on the lower surface of the piezoelectric film 16, is thus formed as shown in FIG. 11E.

It is desirable to use etching for the step of shaping the lower electrode 14, the upper electrode 18 and the piezoelectric film 16, and this shaping step is carried out in a high-temperature environment of approximately 150° C. The lower electrode 14, the upper electrode 18 and the piezoelectric film 16 may be shaped by separate steps (with different methods), or they may be shaped together in the same step (with the same method).

(5) Pressure Chamber Forming Step

Figure 1F:
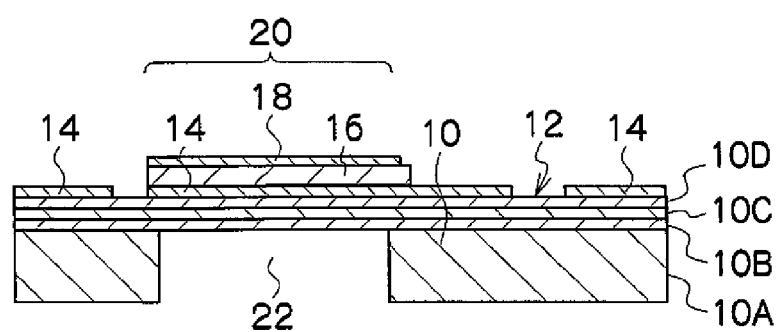

Thereupon, an opening 22 serving as the pressure chamber is formed in the silicon base 1A, by using an etching technique, or the like, as shown in FIG. 1F. Here, the insulating layer 10B, the silicon base 10C and the insulating layer 10D serve as the diaphragm.

(6) Flow Channel Plate Bonding Step, and Nozzle Plate Bonding Step

When the pressure chamber 22 has been formed on the substrate 10 (the silicon base 10A) as shown in FIG. 1F, then a flow channel plate 28 is bonded to the surface of the opening side of the pressure chamber 22 (the surface of the substrate 10 reverse to the surface where the piezoelectric element 20 is arranged). The flow channel plate 28 is formed with a recess section 24 that is to become a common liquid chamber and a supply restrictor, and an opening section 26 that is to become an ejection side flow channel connecting to the pressure chamber 22. When the substrate 10 is bonded with the flow channel plate 28, then the pressure chamber 22 is accurately registered in position with the common liquid chamber, the supply restrictor, and the ejection side flow channel.

Figure 1G:
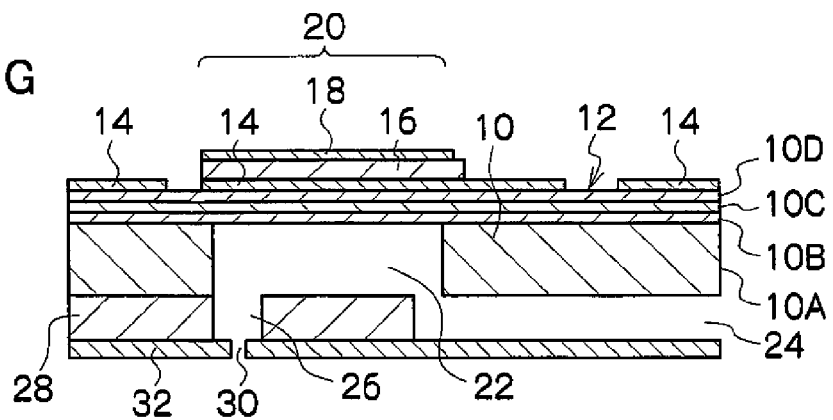

Moreover, a nozzle plate 32, which is formed with a fine hole 30 serving as the nozzle, is bonded to the flow channel plate 28 on the side reverse to the side adjacent to the substrate 10, as shown in FIG. 1G. When the nozzle plate 32 is bonded to the flow channel plate 28, the nozzle 30 and the ejection side flow channel are registered accurately in position.

(7) Flexible Cable (FPC) Bonding Step

Figure 1H:
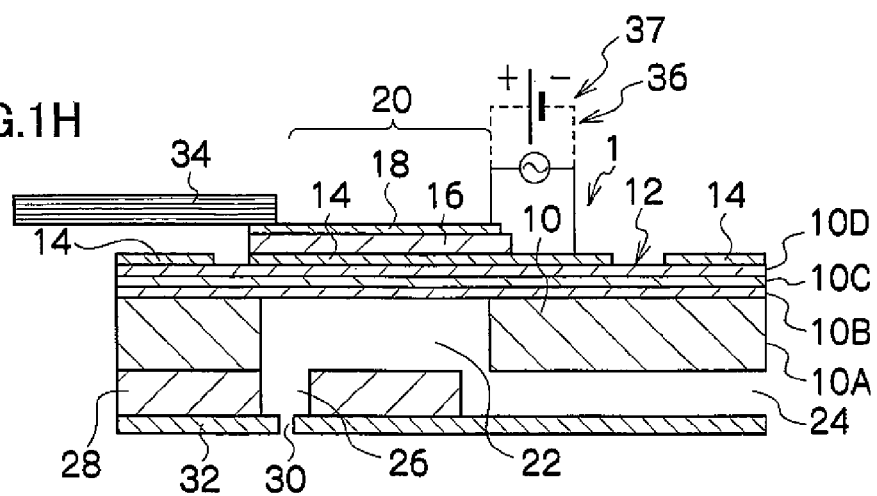

When the structure has been formed by sequentially bonding together the nozzle plate 32, the flow channel plate 28, and the substrate 10 formed with the pressure chamber 22 and the piezoelectric element 20 as shown in FIG. 1G, then a flexible cable (flexible printed circuit (FPC)) 34, which is formed with wiring for the drive voltage to be applied to the piezoelectric element 20, is bonded so as to connect with the upper electrode 18 formed in the step (5), as shown in FIG. 1H. A mode is also possible in which all or a portion of the drive circuitry, such as the switch IC and drive IC, are installed on the FPC 34. Furthermore, a desirable mode is one which uses a connector device to connect the FPC 34.

It is desirable to use a conductive adhesive for bonding the FPC 34. The FPC bonding step is carried out under high-temperature conditions of 130° C. to 150° C.

(8) Polarization Direction Reversal Processing Step

After the above-described steps (1) to (7), a polarization direction reversal processing step is carried out in order to reverse the polarization direction of the piezoelectric film 16 in the piezoelectric element 20. In the polarization direction reversal processing step, an alternating electric field having an intensity equal to or higher than the coercive electric field of the piezoelectric element 20 is applied between the upper electrode 18 and the lower electrode 14 by an alternating electric field generating device 36 (alternating electric field application step), in the head 1 shown in FIG. 1H (after the FPC bonding step (7)), whereupon a direct electric field of intensity not lower than 1 kV/mm and not higher than 10 kV/mm is applied in the direction from the upper electrode 18 toward the lower electrode 14 by a direct electric field generating device 37 (polarization direction reversal processing step) under a predetermined temperature environment (for example, 10° C. to 70° C.).

The coercive electric field of the piezoelectric body is the intensity of the electric field that is capable of changing the polarization of the piezoelectric body, and in the hysteresis curve for the piezoelectric body, taking the horizontal axis to represent the electric field intensity and taking the vertical axis to represent the polarization, then the coercive electric field is indicated by the point where the hysteresis curve crosses the horizontal axis.

The head 1 (final product) manufactured by the head manufacturing process shown in FIGS. 1A to 1H includes components that should not be exposed to high temperatures, such as the switch IC, or materials that cannot be exposed to a high temperature, such as adhesive, and therefore, the polarization reversal step is carried out at a temperature not more than the withstanding temperature of the electronic components, such as the switch IC. Furthermore, even supposing that a high temperature can be applied, it is not possible to apply a high voltage that exceeds the withstanding voltage of the components, and therefore the polarization reversal step is carried out using a low voltage, in a range not exceeding the withstanding voltage of the switch IC, and the like.

The mode shown in FIGS. 1A to 1H are modes where the polarization reversal processing step is carried out after the FPC bonding step, but it is also possible to adopt a mode in which the FPC bonding step is carried out after the polarization reversal processing step. The FPC bonding step may be carried out in temperature conditions of 130° C. to 150° C., and since the direction of polarization may be reversed again and revert back to the direction of polarization upon the deposition if a high temperature is applied to the piezoelectric element after the polarization reversal, then a desirable mode is one where the polarization reversal processing step is carried out after the FPC bonding step in cases where the FPC bonding step is carried out in high temperature conditions of 130° C. to 150° C.

Figure 2:
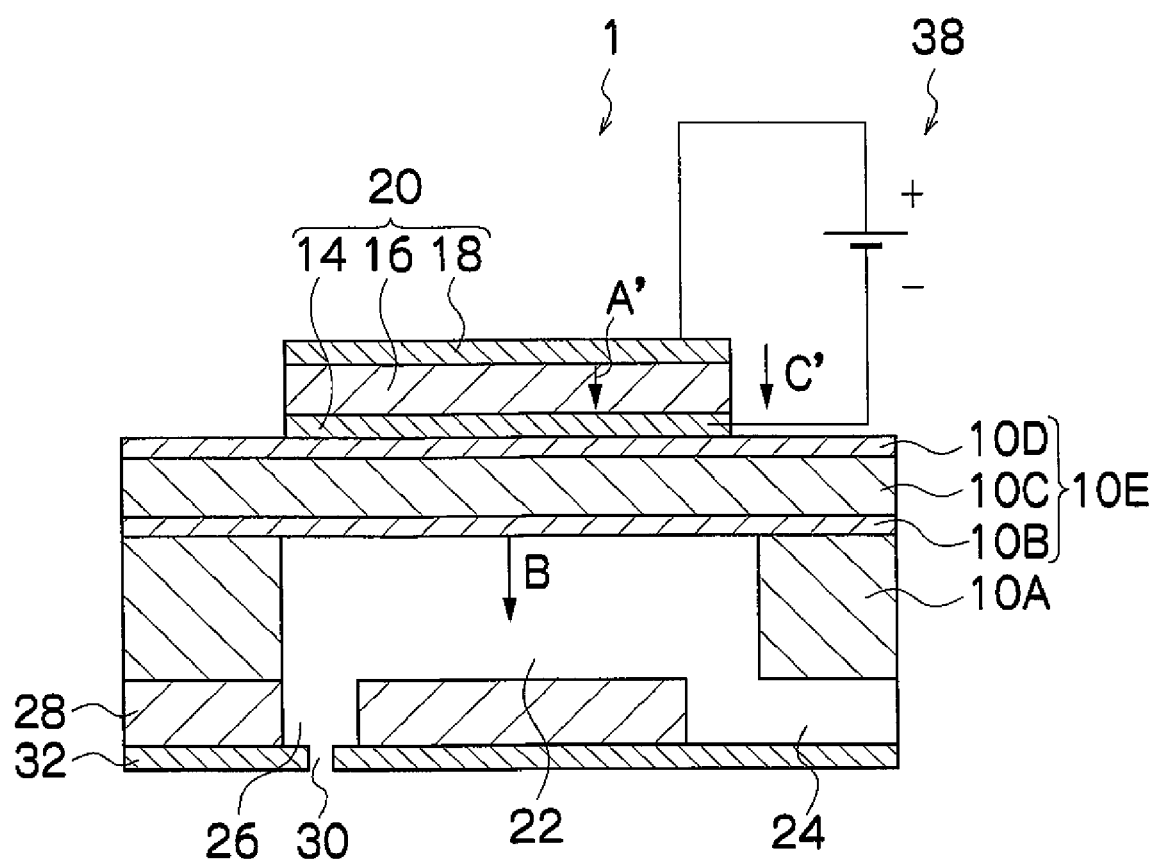
FIG. 2 is a cross-sectional diagram showing the structure of the liquid ejection head manufactured by the process shown in FIGS. 1A to 1H.

FIG. 2 shows the liquid ejection head 1 manufactured through the above-described steps (1) to (8). In FIG. 2, the members corresponding to those in FIGS. 1A to 1H are denoted with the same reference numerals, and explanation thereof is omitted. The FPC 34 shown in FIG. 1H is omitted in FIG. 2.

The liquid ejection head 1 shown in FIG. 2 includes the piezoelectric element 20 having the piezoelectric film 16 epitaxially grown on the lower electrode 14 by sputtering. In the liquid ejection head 1, the upper electrode 18 is used as the address electrode, the lower electrode 14 is used as the ground electrode, and the positive drive voltage is applied to the upper electrode 18 from a drive voltage supply unit 38, and thereby causing the piezoelectric element 20 and the diaphragm 10E to deform so as to reduce the volume of the pressure chamber 22 (to deform in the direction indicated with the arrow B in FIG. 2), so that a droplet is ejected from the nozzle 30.

The polarization direction acquired upon the deposition of the piezoelectric film 16 (piezoelectric element 20) has been reversed, and then the direction of the applied electric field when the lower electrode 14 is used as the ground electrode while the upper electrode 18 is applied with the positive voltage (the direction indicated with an arrow C' in FIG. 2) is now the same with the polarization direction of the piezoelectric element 20 (the direction indicated with an arrow A' in FIG. 2).

FIG. 3 is a graph showing the characteristics of the piezoelectric element 20 before the polarization direction reversal processing and the characteristics of the piezoelectric element 20 after the polarization direction reversal processing. The horizontal axis of the graph shown in FIG. 3 represents the voltage (V) applied to the piezoelectric element 20, and the vertical axis of the graph represents the amount of displacement (nanometers) of the piezoelectric element 20. In the following description, the term "electric field" and the term "voltage" may be used interchangeably, unless stated specifically otherwise.

Figure 8:
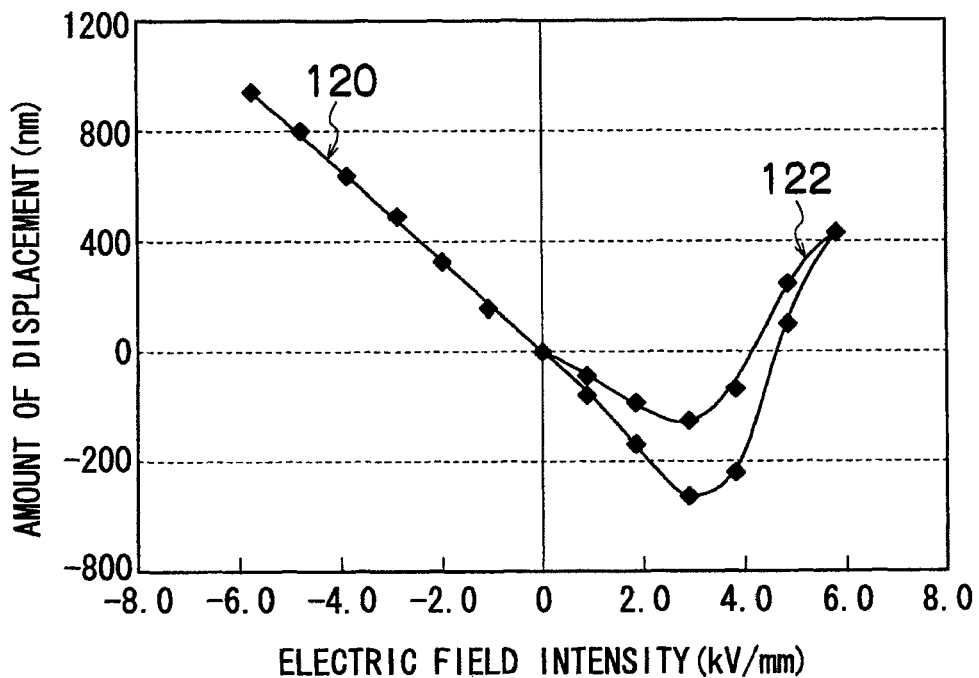
FIG. 8 is a diagram showing the characteristics of the piezoelectric element manufactured by the method according to the related art.
Figure 9:
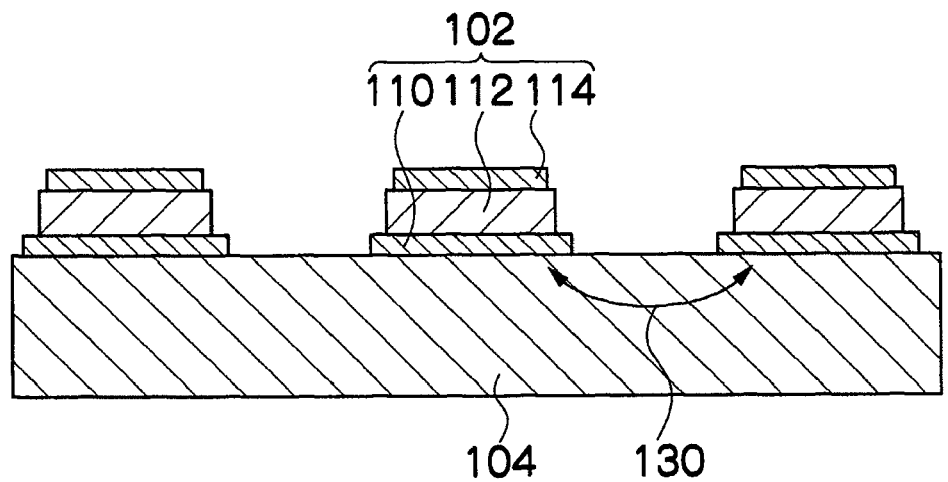
FIG. 9 is a diagram for describing leakage current between the piezoelectric elements in the related art.

The lines 120 and 122 shown in FIG. 3 indicate the characteristics of the piezoelectric element 20 before the polarization direction reversal processing (i.e., the piezoelectric element 102 in the related art described with reference to FIG. 8).

Figure 7:
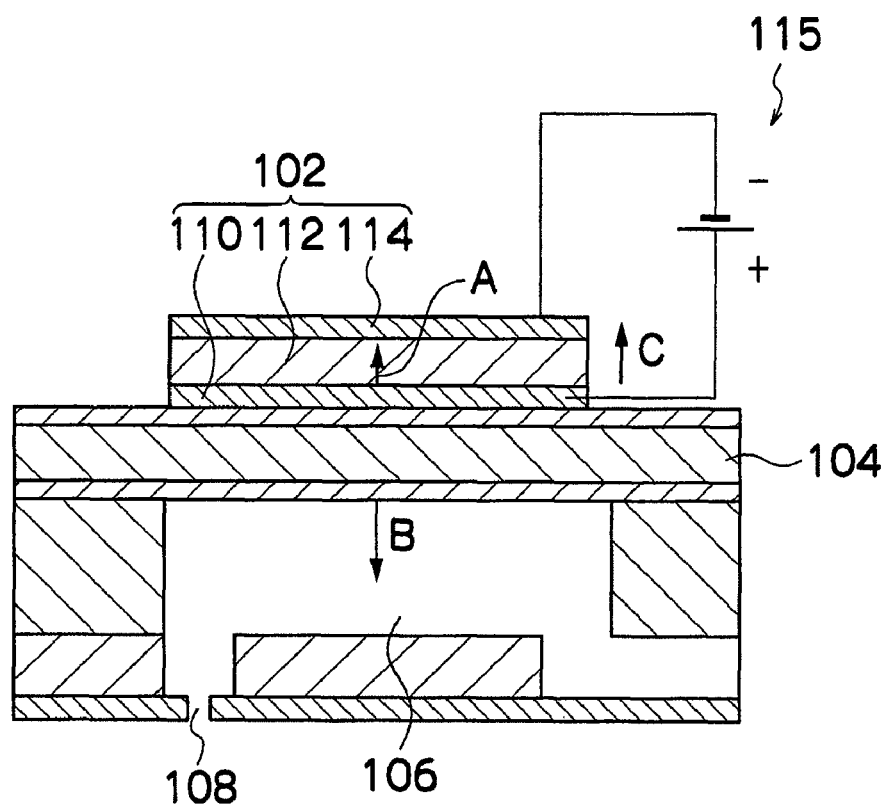
FIG. 7 is a cross-sectional diagram showing the structure of an inkjet head manufactured by a method of manufacturing a liquid ejection head (method of manufacturing a piezoelectric element) according to the related art.

When the lower electrode 14 is used as the ground electrode while the upper electrode 18 is applied with the positive voltage, the direction from the upper electrode 18 toward the lower electrode 14 is taken as a positive direction of the applied electric field (the direction opposite to the direction indicated with the arrow C in FIG. 7). Consequently, the polarization direction of the piezoelectric element 102 (the direction indicated with the arrow A in FIG. 7) is opposite to the positive direction of the applied electric field.

When a voltage in the negative direction (the direction indicated with the arrow C in FIG. 7) is applied to the piezoelectric element 102 (in other words, when the voltage is applied to the piezoelectric element 102 in the same direction as the polarization direction of the piezoelectric element 102), then the piezoelectric element 102 deforms in the direction that causes the ejection of the liquid, and this direction (the direction indicated with the arrow B in FIG. 7) is taken as a positive direction of the displacement of the piezoelectric element 102. The detailed description of the characteristics of the piezoelectric element 20 before the polarization direction reversal processing (i.e., the piezoelectric element 102) has already been given in the description of the related art, and further explanation thereof is omitted here.

On the other hand, the characteristics indicated with a line 40 are the characteristics relating to the applied voltage and the amount of displacement of the piezoelectric element 20 after the polarization direction reversal processing (the piezoelectric element 20 manufactured by the piezoelectric element manufacturing method according to the present embodiment). In the characteristics indicated with the line 40, the lower electrode 14 is used as the ground electrode while the upper electrode 18 is applied with the positive voltage, and in this case, the direction from the upper electrode 18 toward the lower electrode 14 is taken as the positive direction of the applied electric field (the direction indicated with the arrow C' in FIG. 2). Therefore, the polarization direction of the piezoelectric element 20 (the direction indicated with the arrow A' in FIG. 2) is the same with the positive direction of the applied electric field.

When the voltage in the positive direction is applied to the piezoelectric element 20, then the piezoelectric element 20 deforms in the direction that causes the ejection of the liquid (the downward direction in FIG. 2), and this direction (the direction indicated with the arrow B in FIG. 2) is taken as the positive direction of the displacement of the piezoelectric element 20.

As a result of carrying out the polarization direction reversal processing, it is possible to use the characteristics of the portion of the piezoelectric element 20 that has a directly proportional relationship between the applied voltage and the amount of displacement, in order to drive the piezoelectric element 20 to cause the ejection of the liquid. Furthermore, since the peak amount of displacement before the polarization direction reversal processing (i.e., the amount of displacement at the applied voltage of −40V on the line 120), namely 1100 (nm), is the same as the peak amount of displacement after the polarization direction reversal processing (i.e., the amount of displacement at the applied voltage of 40V on the line 40), 1100 (nm), then no deterioration in characteristics is observed as a result of the polarization direction reversal processing.

Figure 4A:
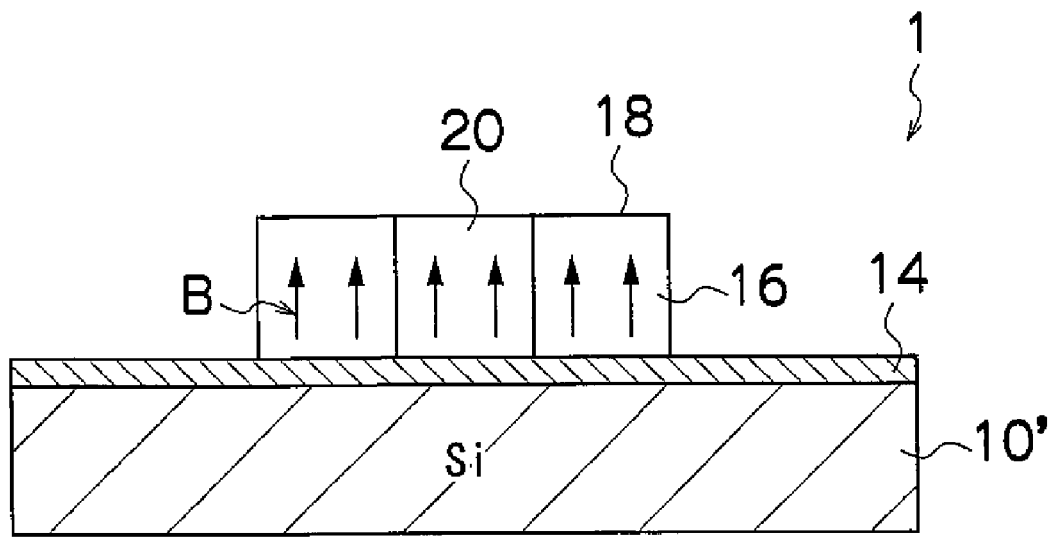
FIGS. 4A and 4B are diagrams describing the coercive electric field.
Figure 4B:
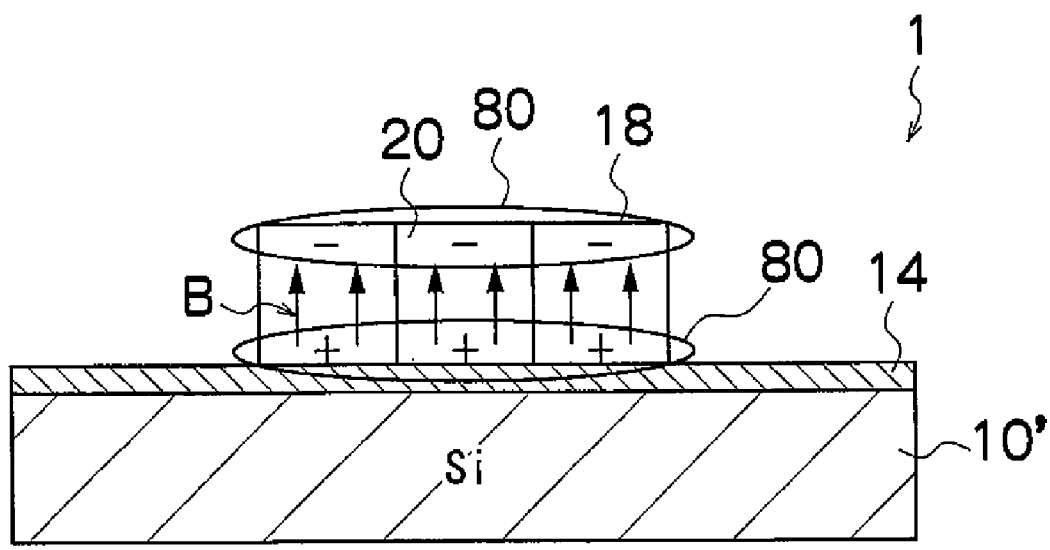

Next, the mechanism leading to the reversal of the polarization direction in the piezoelectric element 20 is described. FIGS. 4A and 4B show schematic drawings of the piezoelectric element 20 mounted on the head 1 (substrate 10'). FIG. 4A shows the piezoelectric element 20 immediately after the deposition of the piezoelectric film, and the direction indicated by the arrow B is the polarization direction. One reason why it is difficult to reverse the polarization direction after the deposition of the piezoelectric film is the constraint of spontaneous polarization caused by the spatial charge. More specifically, as shown in FIG. 4B, the spatial electric field 80 fixes the polarization direction at the deposition of the piezoelectric element 20, and thus makes it difficult to reverse the polarization direction.

In the present embodiment, the spatial charge is removed by applying the alternating electric field equal to or higher than the coercive electric field, to the piezoelectric element 20, and hence reversal of the polarization direction can occur more readily.

To give one concrete example of the alternating electric field, a sinusoidal alternating voltage of 1 MHz and 40V is applied for one hour to the piezoelectric element 20 including the piezoelectric film 16 having the thickness of 4 μm (i.e., the alternating electric field of 10 kV/mm). The waveform and the application time can be changed appropriately.

In FIG. 5, the characteristics indicated with curve 90 shown by solid lines represent the hysteresis characteristics of the piezoelectric film 16 immediately after the deposition. If the alternating electric field equal to or higher than the coercive electric field described in the present embodiment is applied to the piezoelectric film 16 (piezoelectric element 20) having these characteristics, then the piezoelectric film 16 acquires the characteristics indicated with curve 92 shown by broken lines in FIG. 5. The horizontal axis in FIG. 5 represents the electric field intensity (kV/mm) and the vertical axis represents the polarization ($\mu C/cm^2$).

As shown in FIG. 5, it can be seen that the coercive electric field lowers after applying the alternating electric field equal to or higher than the coercive electric field of the piezoelectric film 16 immediately after the deposition. This means that the electric field intensity at which the polarization direction is reversed becomes lower, and therefore reversal of the polarization direction can be achieved more readily. Even if the alternating electric field equal to or higher than the coercive electric field is applied, there is no change in the saturation polarization Pm and the remnant polarization Pr. Hence, it is possible to carry out the polarization direction reversal processing preferably on the head 1 shown in FIG. 1H (the final product).

The present invention displays particularly beneficial effects in a head having a plurality of nozzles and piezoelectric elements. Here, FIGS. 6A to 6C show embodiments of the heads having a plurality of nozzles.

Figure 6A:
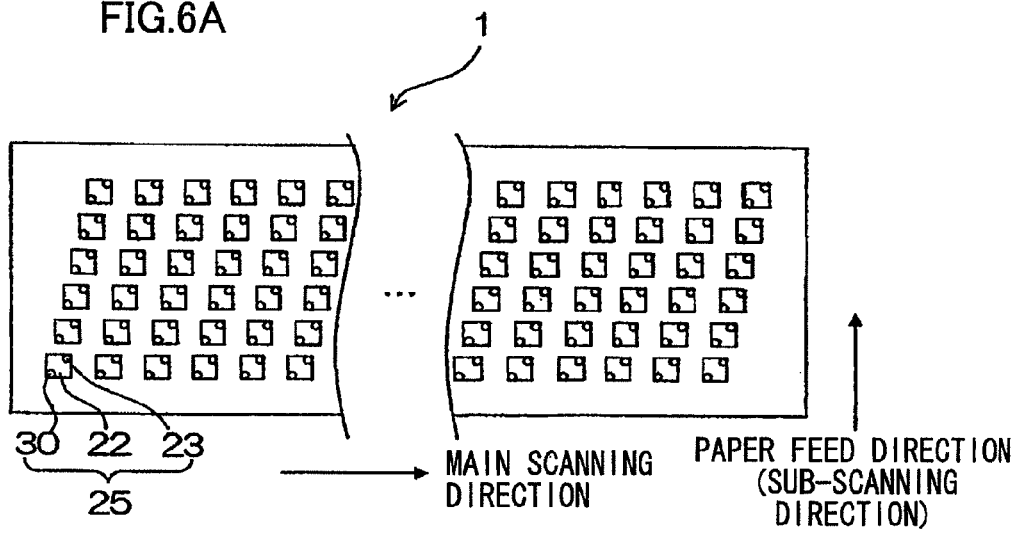
FIGS. 6A to 6C are plan view perspective diagrams showing embodiments of liquid ejection heads manufactured by the process shown in FIGS. 1A to 1H.

The head 1 shown in FIG. 6A is a full-line type of head having a length corresponding to the maximum width of a medium that receives the ejected liquid, wherein a plurality of nozzles 30 are arranged through a length exceeding at least a side of the medium of maximum size (the full width of the range that receives the ejected liquid), on the nozzle surface of the head.

Figure 6B:
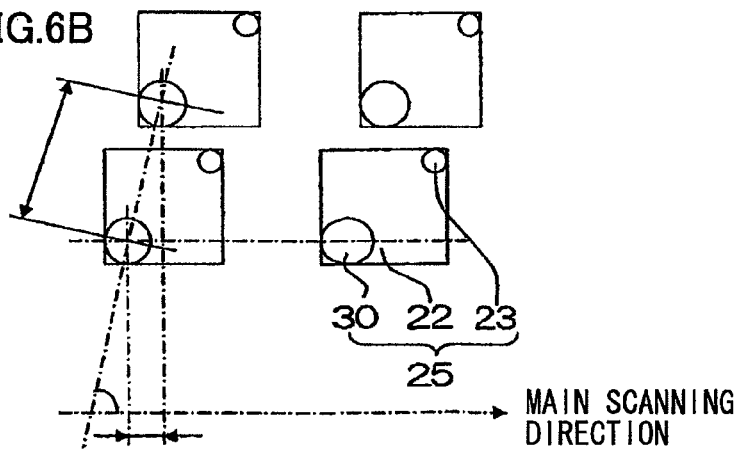
Figure 6C:
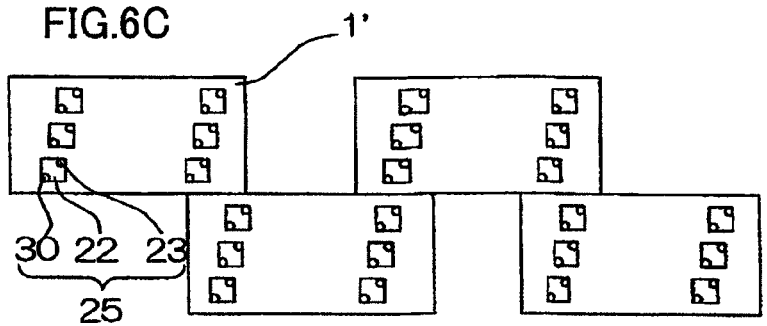

FIG. 6B is an enlarged view of a portion of FIG. 6A, and FIG. 6C is a perspective plan diagram showing another embodiment of the structure of the head 1. As shown in FIGS. 6A and 6B, the head 1 according to the present embodiment has a structure in which a plurality of ink chamber units 25, each including the nozzle 30 forming a liquid ejection hole, a pressure chamber 22 corresponding to the nozzle 30, and a supply port 23, and the like, are disposed two-dimensionally in the form of a staggered matrix, and hence the effective nozzle interval (the projected nozzle pitch) as projected in the lengthwise direction of the head (the sub-scanning direction perpendicular to the conveyance direction of the ejection receiving medium) is reduced and high nozzle density is achieved.

The mode of forming one or more nozzle rows through the length corresponding to the entire width of the ejection receiving medium in the direction substantially perpendicular to the conveyance direction of the ejection receiving medium is not limited to the described above embodiment. For example, instead of the configuration in FIG. 6A, as shown in FIG. 6C, a line head having nozzle rows of the length corresponding to the entire width of the ejection receiving medium can be formed by arranging and combining, in a staggered matrix, short head blocks 1' having a plurality of nozzles 30 arrayed in a two-dimensional fashion. Furthermore, although not shown in the drawings, it is also possible to compose a line head by arranging heads of short dimensions in one row.

When implementing the present invention, the structure of nozzle arrangement is not limited to those in the embodiments shown in the drawings, and various other structures of nozzle arrangement (e.g., arrangement having one nozzle row in the sub-scanning direction) can be adopted.

Furthermore, the scope of application of the present invention is not limited to an ejection method based on a line head, and it is also possible to employ a serial method in which liquid ejection is carried out in the breadthways direction of the recording medium while scanning the recording medium with a short head which is shorter than the breadthways length of the recording medium in the breadthways direction of the recording medium, and when one operation of liquid ejection in the breadthways direction has been completed, the recording medium is moved by a prescribed amount in a direction perpendicular to the breadthways direction, and liquid ejection is carried out in the breadthways direction of the recording medium on the next ejection region, this operation being repeated in such a manner that liquid ejection is carried out over the full surface of the liquid receiving region of the ejection medium.

In the embodiment described above, the mode is described in which the piezoelectric film 16 is deposited by sputtering; however, it is also possible to employ another technique, such as sol gelation, CVD, or the like, in order to deposit the piezoelectric film 16.

Furthermore, silicon and magnesium oxide are given as examples of the material of the substrate of the piezoelectric element 20; however, it is also possible to use a material such as stainless steel.

The present embodiments are described with a single-layer piezoelectric element, which has one layer of the piezoelectric film; however, the present invention can also be applied to a multiple-layer piezoelectric element, in which a plurality of piezoelectric films and a plurality of electrodes are layered together alternately.

The method of manufacturing the inkjet head, which ejects ink from the nozzles, is described as an example of the application of the present invention. However, the present invention can be applied widely to a method of manufacturing a piezoelectric element, which functions as a pressure generating element in a liquid ejection head, and to a method of manufacturing a liquid ejection head including the piezoelectric element.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a liquid ejection head including an ejection port from which liquid is ejected, an ejection side flow channel which is connected to the ejection port, a pressure chamber which is connected to the ejection side flow channel and accommodates the liquid to be ejected from the ejection port, and a piezoelectric element which pressurizes the liquid accommodated in the pressure chamber, the method comprising:
  a lower electrode forming step of forming a lower electrode on a surface of a substrate;
  a piezoelectric film deposition step of depositing a piezoelectric film made of a piezoelectric material by one of epitaxial growth and oriented growth onto a surface of the lower electrode reverse to a surface of the lower electrode that is adjacent to the substrate;
  an upper electrode forming step of forming an upper electrode onto a surface of the piezoelectric film reverse to a surface of the piezoelectric film that is adjacent to the lower electrode;
  a pressure chamber forming step of forming the pressure chamber on a surface of the substrate reverse to the surface on which the lower electrode is formed;
  a flow channel plate bonding step of bonding a flow channel plate formed with the ejection side flow channel to the substrate in which the pressure chamber is formed, after registering the ejection side flow channel and the pressure chamber mutually in position;
  an ejection port plate bonding step of bonding an ejection port plate formed with the ejection port to the flow channel plate, after registering the ejection port and the ejection side flow channel mutually in position;
  a wiring member bonding step of bonding a wiring member to the upper electrode under an environment of first temperature ranging from 130° C. to 150° C., the wiring member having a wiring pattern to be connected to an external device; and a polarization direction reversal step of, immediately after the wiring member bonding step, under an environment of second temperature ranging from 10° C. to 70°, reversing a polarization direction of the piezoelectric film by applying an alternating electric field of an intensity not lower than a coercive electric field of the piezoelectric material, between the upper electrode and the lower electrode, and then applying a direct electric field of an intensity not lower than the coercive electric field in a direction from the upper electrode toward the lower electrode.

2. The method as defined in claim 1, wherein the piezoelectric film deposition step is performed with at least one of sputtering, chemical vapor deposition, and sol gelation.

* * * * *